(12) United States Patent
Manusharow et al.

(10) Patent No.: US 11,961,804 B2
(45) Date of Patent: Apr. 16, 2024

(54) SIZE AND EFFICIENCY OF DIES

(71) Applicant: Intel Corporation, Santa Clara, CA (US)

(72) Inventors: Mathew J. Manusharow, Phoenix, AZ (US); Jonathan Rosenfeld, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 281 days.

(21) Appl. No.: 17/083,177

(22) Filed: Oct. 28, 2020

(65) Prior Publication Data

US 2021/0043572 A1  Feb. 11, 2021

Related U.S. Application Data

(62) Division of application No. 15/774,091, filed as application No. PCT/US2015/000300 on Dec. 23, 2015, now Pat. No. 10,886,228.

(51) Int. Cl.
*H01L 23/48* (2006.01)
*H01L 21/48* (2006.01)
(Continued)

(52) U.S. Cl.
CPC ...... *H01L 23/5383* (2013.01); *H01L 21/4857* (2013.01); *H01L 23/49822* (2013.01);
(Continued)

(58) Field of Classification Search
CPC ..... H01L 25/18; H01L 24/18; H01L 25/0655; H01L 25/50; H01L 25/0652;
(Continued)

(56) References Cited

U.S. PATENT DOCUMENTS 5,254,493 A   10/1993  Kumar
5,872,393 A * 2/1999  Sakai .................. H01L 24/13
                                                    257/664
(Continued)

FOREIGN PATENT DOCUMENTS

JP       2015-170725     9/2015
KR   10-2015-0137824    12/2015
(Continued)

OTHER PUBLICATIONS

Notice of Allowance from Taiwan Patent Application No. 105138084, dated Feb. 5, 2021, 3 pgs.
(Continued)

*Primary Examiner* — Hoa B Trinh
(74) *Attorney, Agent, or Firm* — Schwabe, Williamson & Wyatt, P.C.

(57) ABSTRACT

An integrated circuit package is disclosed. The integrated circuit package includes a first integrated circuit die, a second integrated circuit die, an organic substrate, wherein both the first integrated circuit die and the second integrated circuit die are connected to the organic substrate, a multi-die interconnect bridge (EMIB) embedded within the organic substrate, and a termination resistor associated with a circuit in the first integrated circuit die, wherein the termination resistor is located within the multi-die interconnect bridge embedded within the organic substrate.

9 Claims, 8 Drawing Sheets

(51) Int. Cl.
  *H01L 23/498* (2006.01)
  *H01L 23/538* (2006.01)
  *H01L 23/64* (2006.01)
  *H01L 25/00* (2006.01)
  *H01L 25/065* (2023.01)
  *H01L 23/00* (2006.01)

(52) U.S. Cl.
  CPC .......... *H01L 23/642* (2013.01); *H01L 23/647* (2013.01); *H01L 25/065* (2013.01); *H01L 25/0655* (2013.01); *H01L 25/50* (2013.01); H01L 23/49816 (2013.01); H01L 23/5385 (2013.01); H01L 24/16 (2013.01); H01L 2224/16225 (2013.01); H01L 2224/16227 (2013.01); H01L 2224/16235 (2013.01); H01L 2924/15192 (2013.01)

(58) Field of Classification Search
  CPC ............... H01L 25/065; H01L 23/4981; H01L 23/5385; H01L 23/647; H01L 23/4982; H01L 23/5383
  See application file for complete search history.

(56) References Cited

U.S. PATENT DOCUMENTS

| | | | |
|---|---|---|---|
| 8,916,981 B2 | 12/2014 | Xiu | |
| 8,946,900 B2 | 2/2015 | Qian | |
| 9,275,955 B2 | 3/2016 | Mahajan | |
| 9,508,636 B2 | 11/2016 | Zhang | |
| 10,615,133 B2 | 4/2020 | Kamgaing | |
| 2009/0321939 A1 | 12/2009 | Candrasekaran | |
| 2011/0024917 A1 | 2/2011 | Bhalla et al. | |
| 2014/0174807 A1* | 6/2014 | Roy | H01L 25/0655 156/293 |
| 2014/0264791 A1 | 9/2014 | Manusharow et al. | |
| 2015/0001717 A1* | 1/2015 | Karhade | H01L 25/0655 257/741 |
| 2015/0279881 A1* | 10/2015 | Shizukuishi | H01L 21/76898 438/67 |
| 2016/0240291 A1* | 8/2016 | Tanaka | H01C 1/142 |

FOREIGN PATENT DOCUMENTS

| | | |
|---|---|---|
| TW | 200509524 | 3/2005 |
| TW | 201735275 | 10/2017 |
| WO | WO 2017111790 | 6/2018 |

OTHER PUBLICATIONS

International Search Report and Written Opinion for International Application No. PCT/US2015/000300, dated Sep. 22, 2016, 8 pgs.
International Preliminary Report on Patentability for International Application No. PCT/US2015/000300, dated Jul. 5, 2018, 7 pgs.
Office Action from Taiwan Patent Application No. 105138084, dated Feb. 7, 2020, 8 pgs.
Office Action from Taiwan Patent Application No. 105138084, dated Jul. 20, 2020, 10 pgs.
Notice of Allowance for U.S. Appl. No. 17/555,213 dated Mar. 28, 2023, 11 pgs.

* cited by examiner

SIZE AND EFFICIENCY OF DIES

CROSS-REFERENCE TO RELATED APPLICATIONS

This patent application is a divisional of U.S. patent application Ser. No. 15/774,091, filed May 7, 2018, which is a U.S. National Phase Application under 35 U.S.C. § 371 of International Application No. PCT/US2015/000300, filed Dec. 23, 2015, entitled "IMPROVING SIZE AND EFFICIENCY OF DIES," which designates the United States of America, the entire disclosure of which are hereby incorporated by reference in their entirety and for all purposes

TECHNICAL FIELD

Embodiments described herein generally relate to embedded multi-die interconnect bridges.

BACKGROUND

Microelectronic devices such as IC (integrated circuit) packages include transistors and other electrical components such as capacitors. In some example embodiments, a given package includes a plurality of different IC dies that need to be interconnected. Indeed, new chip technologies require as many interconnections as possible between each of the dies.

However, current technologies are limited in the number of chips or dies that can be interconnected based on the size of the silicon chips or dies that can be manufactured. However, it would be desirable to identify a way to interconnect multiple dies in a way that is not limited by the size of silicon chips that can be manufactured.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

In some example embodiments, it would be beneficial to connect multiple dies in a way that is not limited by the size of silicon that can be produced. One such method is the embedded multi-die interconnect bridge (EMIB).

The EMIB is a silicon component that is embedded into the substrate at the time that the substrate is manufactured. Each EMIB includes connections that allow rapid communication between two different chips/dies that are both connected to the EMIB by being attached to the substrate.

In some example embodiments, a given die includes a circuit that allows for high speed input and output from the die. In some example embodiments, the input-output circuit includes a buffer that uses a metal resistor for termination. In traditional chips/dies, the metal resistor ends up taking up to 50 percent of the space allocated to the input/output buffer on the chip.

In an example embodiment, that metal resistor can be incorporated into the EMIB. By including the metal resistors in the EMIB when it is fabricated, the input/output buffer function is unaffected, but the space needed on the silicon chip is greatly reduced, such that additional circuitry can be added or the total size of the die can be reduced.

In some example embodiments, fabricating the EMIB to include the metal resistor is cheaper than including the metal resistor on the chip. At the same time, additional space is freed on the silicon chip for additional circuitry and/or capabilities.

In some example embodiments, one or more capacitors are included on the EMIB. In some example embodiments, the capacitors are metal insulator capacitors and are placed in the EMIB as close to the dies as possible. The capacitors reduce impedance in the dies and allow additional integrated circuit designs that would be difficult or impossible without the additional impedance provided by metal-insulator-metal (MIM) capacitors.

Figure 1A:
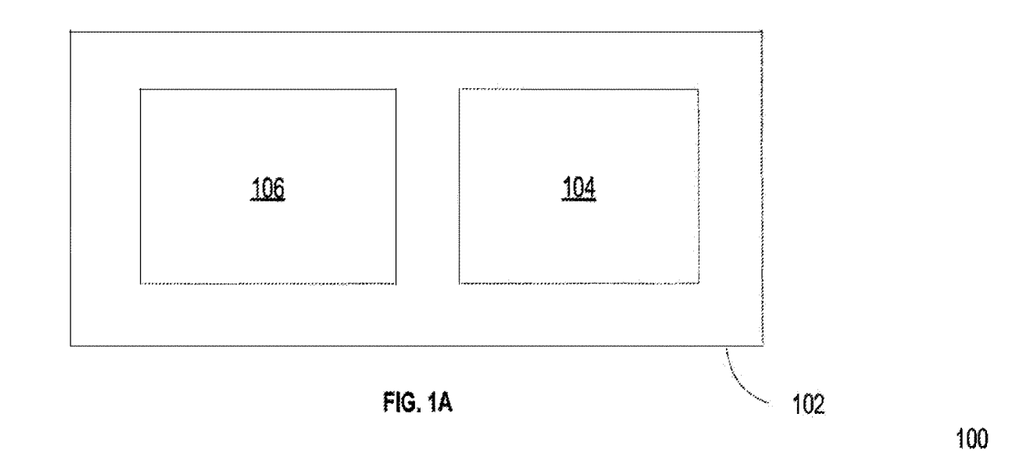
FIG. 1A shows a representation of an example embodiment of a multi-die IC package using silicon technology.

FIG. 1A show a representation of an example embodiment of a multi-die IC package 100 using silicon technology. In this example embodiment, there are two dies 104 and 106. Each die 104, 106 is connected to a larger piece of silicon 102. In some example embodiments, each die 104 and 106 is a processor die. In other example embodiments, the dies 104, 106 can be other IC circuits (e.g., memory). In yet other example embodiments, each die 104, 106 on the silicon 102 is of a different type such that the package is heterogeneous.

In some example embodiments, the dies (104 and 106) are attached to the silicon 102 as part of the silicon fabrication process. In this way, the total size of the silicon 102 layer restricts the number of total dies that can be included in the multi-die package.

Figure 1B:
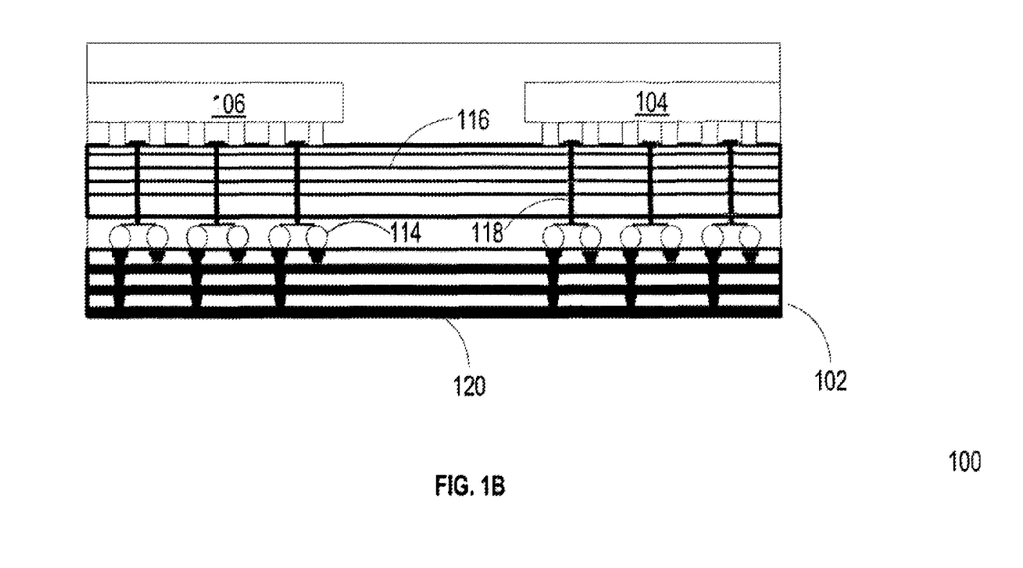
FIG. 1B shows a representation of a cross-section of a multi-die IC package in some example embodiments.

FIG. 1B shows a representation of a cross-section of a multi-die IC package 100 in some example embodiments. In this example, two dies (106 and 104) are connected to a silicon 102 layer.

In some example embodiments, the communication between the connection between the dies 104, 106 and the silicon 102 is handled by one or more through silicon vias (TSV) 118 that are holes created through the silicon 102 and filled with a conductive material such as copper or solder. In some example embodiments, these TSVs are expensive to manufacture.

In some example embodiments, the dies 104, 106 communicate with each other through a series of interconnecting communication lines (for example, line 116) in the silicon layer 102.

In some example embodiments, the entire silicon layer 110 is connected to the substrate 120 through a series of connections. For example, in this case the silicon layer 102 is connected to the substrate 120 through a ball grid array 114. In some example embodiments, the ball grid array 114 connects to a series of conductive lines in the substrate 120 that deliver power to the silicon 102.

Figure 2:
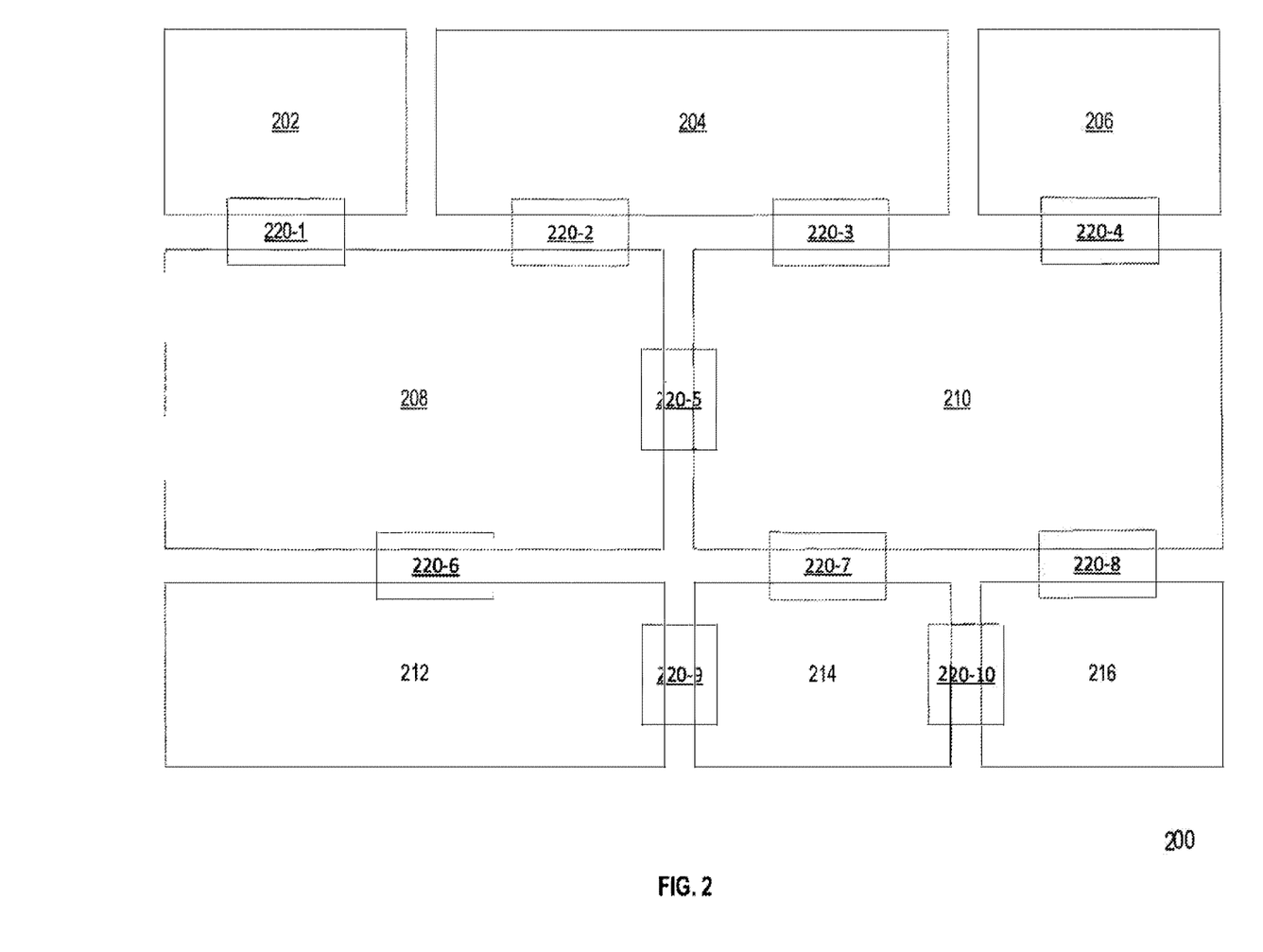
FIG. 2 shows a representation of an example embodiment of a multi-die IC package using silicon technology.

FIG. 2 shows a representation of an example embodiment of a multi-die IC package 200 using silicon technology. In this example embodiment, there are a plurality of dies (202-216). There is no requirement that each die 202-216 be the same size. In addition, the dies 202-216 themselves are not required to be included in the same manufactured silicon layer as in past multi-die packages.

Instead, each die 202-216 in the multi-die package 200 can be connected to at least one other die 202-216 via one or more embedded multi-die interconnect bridges (EMIBs) 220-1 to 220-10 that enable communication between two dies. The EMIBs 220-1 to 220-10 are embedded in a substrate. The one or more dies 202-216 are then connected (both physically and electronically) to the EMIBs 220-1 to 220-10 as needed to enable communication between different dies.

In this way, the size and complexity of a multi-die is not limited based on the size of silicon wafer that can be produced. Furthermore, each die can differ in capabilities or purpose (e.g., memory, processors, and so on).

Figure 3:
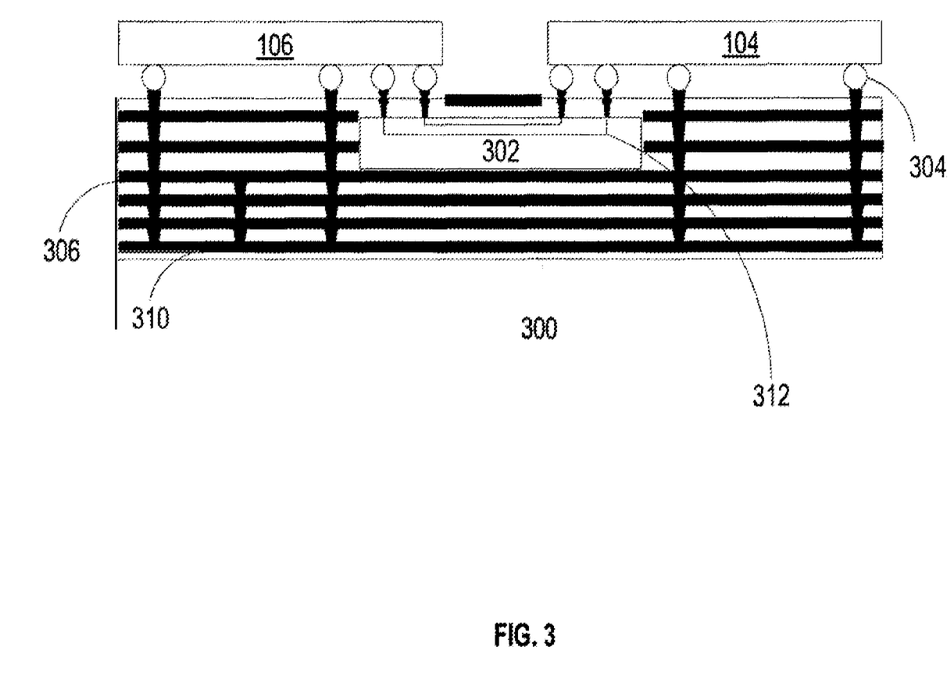
FIG. 3 shows a representation of a cross-section of a multi-die IC package with an embedded multi-die interconnect bridge (EMIB) in some example embodiments.

FIG. 3 shows a representation of a cross-section of a multi-die IC package with an embedded multi-die interconnect bridge (EMIB) in some example embodiments. In this example, two dies (106 and 104) are connected via an embedded multi-die interconnect bridge (EMIB) 302 that is embedded in a substrate 306 layer.

In some example embodiments, the EMIB 302 is composed of silicon and includes one or more communication lines 312.

In some example embodiments, each die 104, 106 is connected to both the EMIB 302 and the substrate 306 layer with one or more physical and electrical connections 304. For example, solder can be used to create a physical connection between the dies (104 to 106) and the EMIB 302 and the substrate 306.

The substrate 306 includes one or more power supply lines 310 that connect to the one or more dies 104, 106 and provide needed power. In some example embodiments, the power supply lines 310 are composed of a conductive material (such as copper) and laid into the substrate 306 during the substrate manufacturing process.

In some example embodiments, the EMIB 302 is composed of silicon with conductive communication lines 312 laid within. In some example embodiments, the process for creating the EMIB 302 is much simpler and cheaper than creating an IC die because the complexity of the EMIB 302 is much less than that of a processor or memory component.

Figure 4:
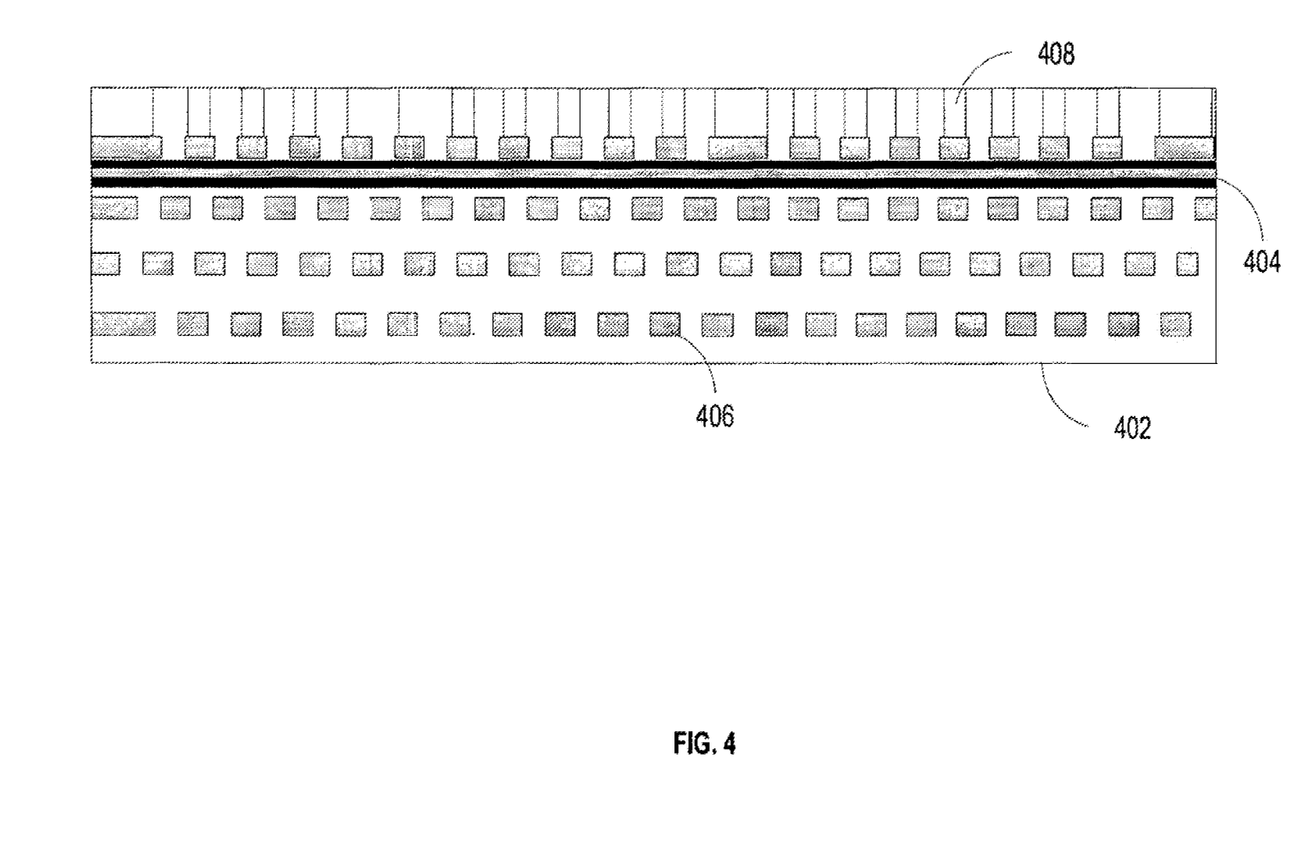
FIG. 4 shows a representation of a cross-section of an embedded multi-die interconnect bridge (EMIB) in some example embodiments.

FIG. 4 shows a representation of a cross-section of an embedded multi-die interconnect bridge (EMIB) 402 in some example embodiments. In this example, the EMIB 402 includes a series of communication channels 406 through the bridge.

In some example embodiments, the channels 406 are created with conductive material and are placed in the silicon of the EMIB 402 during the fabrication of said EMIB 402.

In some example embodiments, the communication channels 406 allow information to be passed through the EMIB 402 from one die to another. In other example embodiments, the channels 406 can also provide needed power to the one or more dies attached to the EMIB 402.

In some example embodiments, one or more dies are connected to the EMIB 402 through connection points (e.g., 408). The one or more dies also receive power through connections with either the EMIB 402 or the organic substrate itself. Power is supplied from a power source to the one or more dies. However, to avoid noise in the signal, one or more decoupling capacitors are included in the device to reduce impedance and reduce the amount of noise in the power signal.

As chips and devices grow increasingly smaller, the need for such decoupling capacitors increases (as circuits are more and more sensitive to electrical noise within the circuit). The effectiveness of the capacitors in reducing noise is associated with the distance between the capacitors and the circuits for which noise needs to be reduced.

In some example embodiments, EMIBs are fabricated to include a capacitor 404. Including a capacitor 404 in the EMIB 402 provides capacitance at a very small physical distance from the die components that are connected to the EMIB 402.

In some example embodiments, the capacitor 404 is a metal-in-metal layer EMIB and does not include any other active devices (e.g., no active device layer).

With a metal-insulator-metal (MIM) capacitor 404 included with the EMIB, the capacitor is more effective at reducing impedance (and therefore noise) than if the capacitor was placed outside of the EMIB.

Figure 5:
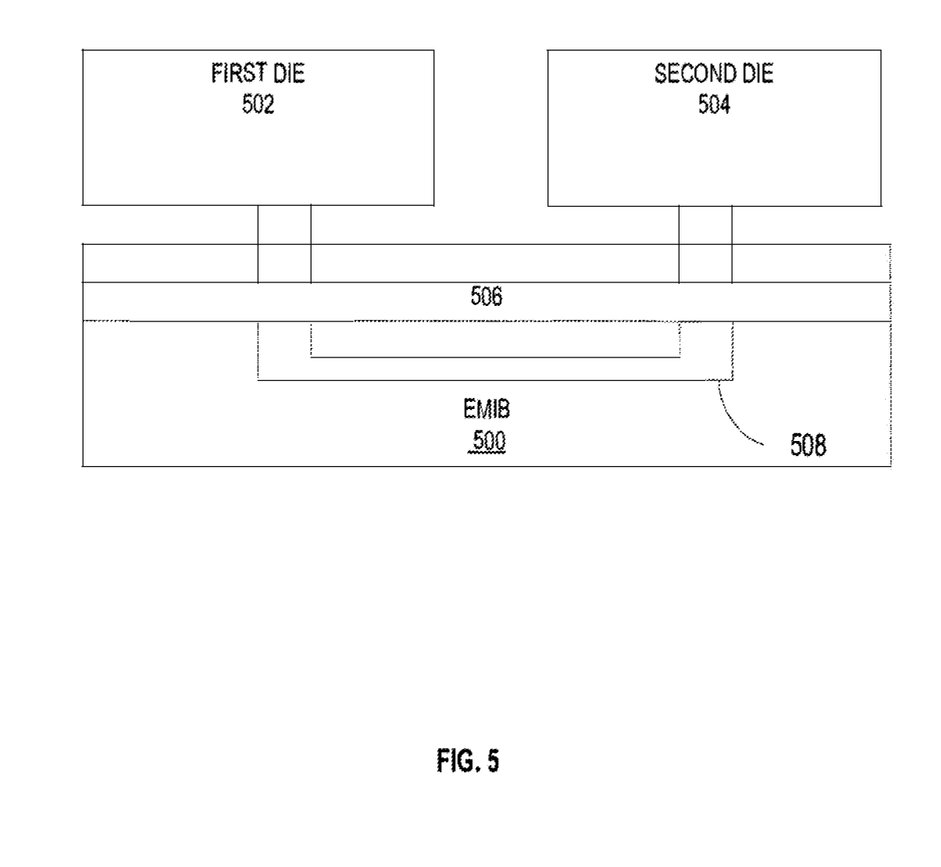
FIG. 5 shows a representation of a block diagram of an embedded multi-die interconnect bridge (EMIB) in some example embodiments.

FIG. 5 shows a representation of a block diagram of an embedded multi-die interconnect bridge (EMIB) 500 in some example embodiments. In this example, the EMIB 500 connects to a first die 502 and a second die 504.

In this example, the EMIB 500 also includes a capacitor 506. As noted above, the capacitor 506 serves to reduce impedance, and therefore electric noise, in the power supply for the first die 502 and the second die 504. By incorporating the capacitor 506 (for example, a MIM capacitor) into the EMIB 500, the capacitor 506 is able to be much closer to the actual circuitry of the dies 502, 504 and thus is able to more fully reduce noise.

Figure 6:
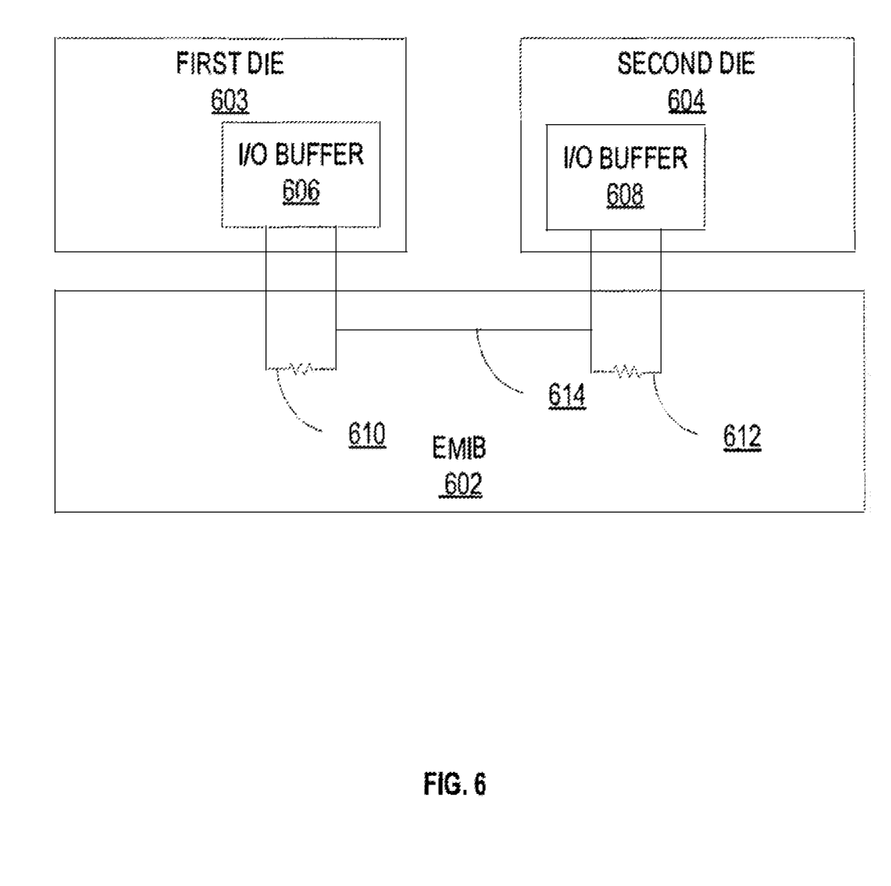
FIG. 6 shows a representation of a block diagram of an embedded multi-die interconnect bridge (EMIB) in some example embodiments.

FIG. 6 shows a representation of a block diagram of an embedded multi-die interconnect bridge (EMIB) 602 in some example embodiments. In this example, the EMIB 602 includes two dies 603, 604 that are both connected to the EMIB 602. In this example, the dies 603, 604 each include an input/output buffer 606, 608, respectively, that assists with communication between the two dies 602 and 604 (and any other components).

Each input/output buffer 606, 608 includes a metal termination resistor 610 and 612. In the past, the metal termination resistor was located on the silicon of the die (e.g., the integrated circuit includes a metal resistor). However, the size of the integrated circuits used on dies has decreased more quickly than the size of metal resistors. As such, the metal resistors take an increasingly large percentage of the space on the die.

In this example, the metal termination resistors 610, 612 are placed on the EMIB 602. In this way, the termination resistors 610 and 612 no larger are placed on their respective dies (603 or 604). Instead, the termination resistors (610 and 612) are integrated into the EMIB 602 during the fabrication process. Because the EMIB fabrication process is significantly less expensive than fabricating a dense integrated circuit, locating the termination resistors (610 and 612) on the EMIB 602 reduces the cost of producing the dies 603, 604.

Similarly, the first die 603 and the second die 604 both have more room for the addition of additional circuitry, which adds additional capability to the integrated circuit.

In this example, the EMIB 602 also includes a communication line 614 between the termination resistor 610 associated with the first die 603 and the termination resistor 612 associated with the second die 604. Although shown as a single line 614, the communication pathways connecting the two termination resistors 610 and 612 may include more than one channel or line. The first die 603 and the second die 604 can then directly talk to one another.

Figure 7:
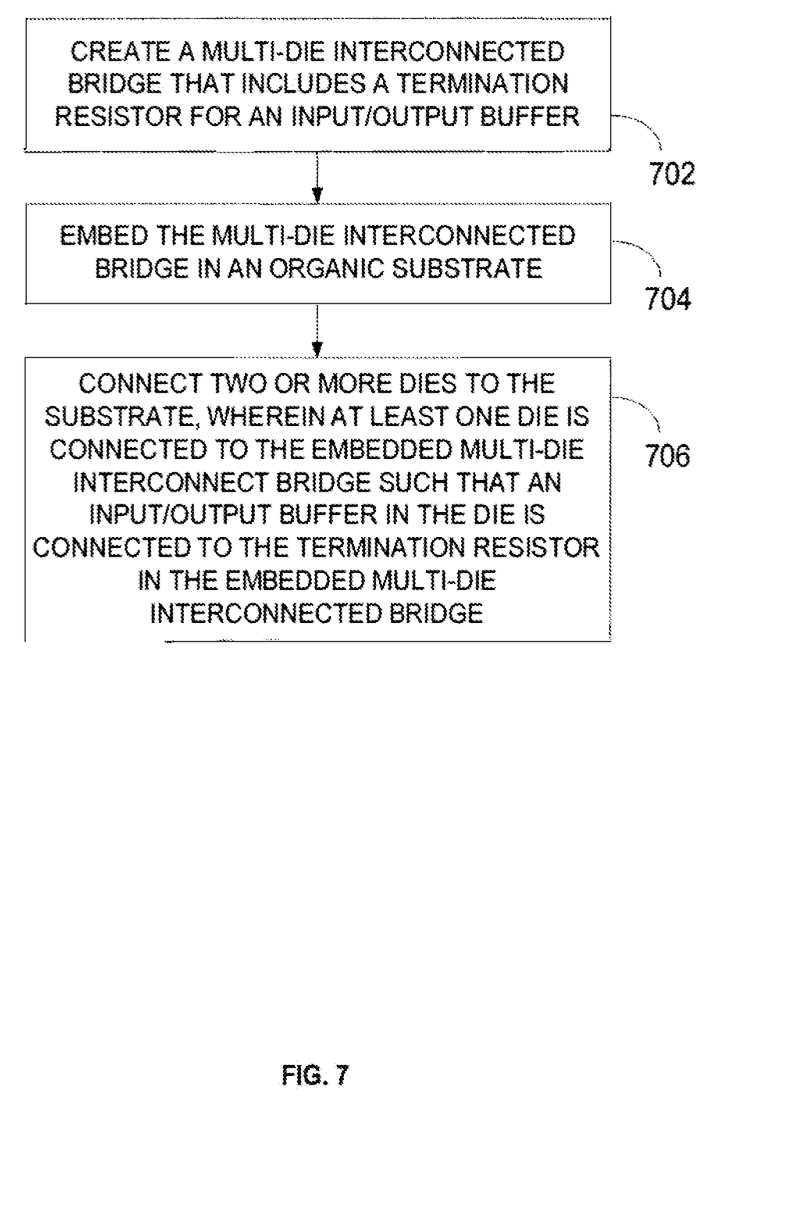
FIG. 7 shows a flow diagram of a method of including additional components in an EMIB, in accordance with some example embodiments.

FIG. 7 shows a flow diagram of a method of including additional components in an EMIB, in accordance with some example embodiments.

In some example embodiments, a multi-die interconnect bridge is created (702) that includes a termination resistor for an input/output buffer. The multi-die interconnect bridge is created using silicon and includes one or more communication channels for connecting two or more heterogeneous dies.

The multi-die interconnect bridge is then embedded (704) in an organic substrate. In some example embodiments, the process of creating the organic substrate also includes, as part of creating the substrate, creating the embedded interconnect bridge simultaneously.

Two or more dies are then connected (706) to the organic substrate, wherein at least one die is connected to the EMIB such that an input/output buffer in the die is connected to the termination resistor in the embedded multi-die interconnect bridge.

Figure 8:
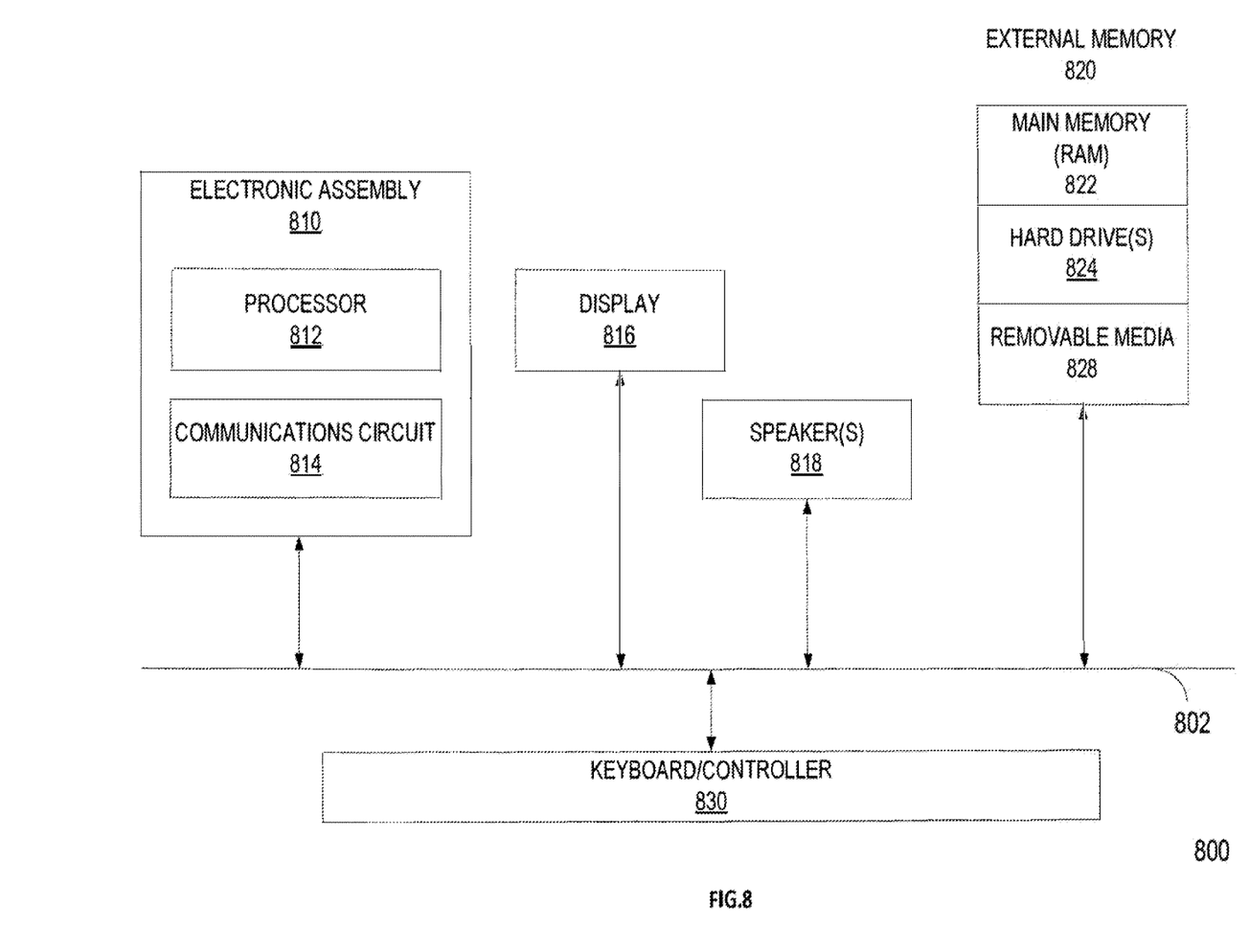
FIG. 8 is block diagram of an electronic system in accordance with some example embodiments.

An example of an electronic device using semiconductor chip assemblies and solders as described in the present disclosure is included to show an example of a higher-level device application for the described example embodiments. FIG. 8 is a block diagram of an electronic device 800 incorporating at least one solder and/or method in accordance with at least one example embodiment. Electronic device 800 is merely one example of an electronic system in which example embodiments can be used. Examples of electronic devices 800 include, but are not limited to, personal computers, tablet computers, mobile telephones, game devices, MP3 or other digital music players, etc. In this example, electronic device 800 comprises a data processing system that includes a system bus 802 to couple the various components of the system. System bus 802 provides communications links among the various components of the electronic device 800 and can be implemented as a single bus, as a combination of busses, or in any other suitable manner.

An electronic assembly 810 is coupled to system bus 802. The electronic assembly 810 can include any circuit or combination of circuits. In one embodiment, the electronic assembly 810 includes a processor 812 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in electronic assembly 810 are a custom circuit, an application-specific integrated circuit (ASIC), or the like, such as, for example, one or more circuits (such as a communications circuit 814) for use in wireless devices like mobile telephones, personal data assistants, portable computers, two-way radios, and similar electronic systems. The IC can perform any other type of function.

The electronic device 800 can also include an external memory 820, which in turn can include one or more memory elements suitable to the particular application, such as a main memory 822 in the form of random access memory (RAM), one or more hard drives 824, and/or one or more drives that handle removable media 826 such as compact disks (CD), flash memory cards, digital video disk (DVD), and the like.

The electronic device 800 can also include a display device 816, one or more speakers 818, and a keyboard and/or controller 830, which can include a mouse, trackball, touch screen, voice-recognition device, or any other device that permits a system user to input information into and receive information from the electronic device 800.

These and other examples and features of the present molds, mold systems, and related methods will be set forth in part in the following detailed description. This overview is intended to provide non-limiting examples of the present subject matter—it is not intended to provide an exclusive or exhaustive explanation. The detailed description below is included to provide further information about the present molds, mold systems, and methods.

To better illustrate the method and apparatuses disclosed herein, a non-limiting list of embodiments is provided here:

Example 1 includes an integrated circuit package, comprising a first integrated circuit die; a second integrated circuit die; an organic substrate, wherein both the first integrated circuit die and the second integrated circuit die are connected to the organic substrate; a multi-die interconnect bridge (EMIB) embedded within the organic substrate; and a termination resistor associated with a circuit in the first integrated circuit die, wherein the termination resistor is located within the multi-die interconnect bridge embedded within the organic substrate.

Example 2 includes the integrated circuit package of example 1, wherein the circuit in the first integrated circuit die is an input output buffer.

Example 3 includes the integrated circuit package of any of examples 1-2, wherein the first integrated circuit die is connected to the multi-die interconnect bridge embedded within the organic substrate.

Example 4 includes the integrated circuit package of any of examples 1-3, wherein the termination resistor is a metal resistor.

Example 5 includes the integrated circuit package of example 4, wherein the termination resistor includes copper, nickel, and titanium.

Example 6 includes an integrated circuit package, comprising a first integrated circuit die; a second integrated circuit die; an organic substrate, wherein both the first integrated circuit die and the second integrated circuit die are connected to the organic substrate; a multi-die interconnect bridge (EMIB) embedded within the organic substrate; and a capacitor located within the multi-die interconnect bridge embedded within the organic substrate.

Example 7 includes the integrated circuit package of example 6, wherein the first integrated circuit die is connected to the multi-die interconnect bridge embedded within the organic substrate and the capacitor is physically close enough to the first integrated circuit die to reduce impedance in the first integrated circuit die.

Example 8 includes the integrated circuit package of any of examples 6-7, wherein the capacitor is a metal insulator metal capacitor.

Example 9 includes the integrated circuit package of any of examples 6-8, wherein the capacitor includes a high dielectric layer.

Example 10 includes the integrated circuit package of any of examples 6-9, wherein the capacitor is a decoupling capacitor.

Example 11 includes the integrated circuit package of any of examples 6-10, wherein the capacitor is associated with the power delivery of an input output circuit in the first die.

Example 12 includes a method comprising creating a multi-die interconnect bridge; embedding the multi-die interconnect bridge (EMIB) within the organic substrate; adding a termination resistor associated with a circuit in a first integrated circuit die to the embedded multi-die interconnect bridge; and connecting a first die and a second die to the organic substrate; and connecting at least the first die to the embedded multi-die interconnect bridge (EMIB) such that a circuit originating the first die connects to the termination resistor is located within the multi-die interconnect bridge embedded within the organic substrate.

Example 13 includes the method of example 12, wherein the circuit in the first integrated circuit die is an input output buffer.

Example 14 includes the method of any of examples 12-13, wherein the termination resistor is a metal resistor.

Example 15 includes the method of example 14, wherein the termination resistor includes copper, nickel, and titanium.

Example 16 includes the method of any of examples 12-15, wherein the circuit in the first integrated circuit die is an input output buffer.

Example 17 includes the method of any of examples 12-16, further comprising adding a capacitor to the embedded multi-die interconnect bridge.

Example 18 includes the method of any of examples 12-17, wherein the capacitor is a metal insulator metal capacitor.

Example 19 includes the method of any of examples 12-18, wherein the capacitor includes a high dielectric layer.

Example 20 includes the method of any of examples 12-119, wherein the capacitor is a decoupling capacitor.

Term Usage

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing particular example embodiments only and is not intended to be limiting. As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

The invention claimed is:

1. A method comprising creating an interconnect bridge; embedding the interconnect bridge within an organic substrate, the interconnect bridge comprising a termination resistor and a decoupling capacitor therein, the termination resistor and the decoupling capacitor associated with a circuit in a first die to be coupled to the embedded interconnect bridge;
connecting the first die and a second die to the organic substrate; and
connecting the first die and the second die to the interconnect bridge such that the circuit originating in the first die connects to the termination resistor and to the decoupling capacitor located within the interconnect bridge embedded within the organic substrate.

2. The method of claim 1, wherein the circuit in the first die is an input output buffer.

3. The method of claim 1, wherein the termination resistor is a metal resistor.

4. The method of claim 3, wherein the termination resistor includes copper, nickel, and titanium.

5. The method of claim 1, wherein the circuit in the first die is an input output buffer.

6. A method of fabricating an integrated circuit package, the method comprising:
embedding an interconnect bridge within an organic substrate, the interconnect bridge comprising:
a first termination resistor therein;
a second termination resistor therein;
a decoupling capacitor therein; and
a communication pathway therein, the communication pathway directly coupling the first termination resistor and the second termination resistor;
connecting a first integrated circuit die to the organic substrate and to the interconnect bridge, wherein a first input output buffer circuit in the first integrated circuit die is associated with the first termination resistor and the decoupling capacitor of the interconnect bridge; and
connecting a second integrated circuit die to the organic substrate and to the interconnect bridge, wherein a second input output buffer circuit in the second integrated circuit die is associated with the second termination resistor and the decoupling capacitor of the interconnect bridge, and wherein the second integrated circuit die is electrically coupled to the first integrated circuit die by the interconnect bridge.

7. The method of claim 6, wherein the first integrated circuit die is connected to the interconnect bridge, and wherein the second integrated circuit die is connected to the interconnect bridge.

8. The method of claim 6, wherein the first termination resistor is a first metal resistor, and the second termination resistor is a second metal resistor.

9. The method of claim 8, wherein each of the first termination resistor and the second termination resistor includes copper, nickel, and titanium.

* * * * *